United States Patent
Nakata et al.

(10) Patent No.: US 8,330,828 B2
(45) Date of Patent: Dec. 11, 2012

(54) DEVICE AND IMAGING SYSTEM

(75) Inventors: Yasushi Nakata, Yamato (JP); Masataka Ito, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 259 days.

(21) Appl. No.: 12/709,840

(22) Filed: Feb. 22, 2010

(65) Prior Publication Data

US 2010/0214432 A1 Aug. 26, 2010

(30) Foreign Application Priority Data

Feb. 24, 2009 (JP) ................................ 2009-041298
Jan. 22, 2010 (JP) ................................ 2010-012582

(51) Int. Cl.
- *H04N 5/335* (2011.01)
- *H04N 5/225* (2006.01)
- *H04N 3/14* (2006.01)
- *G03B 13/00* (2006.01)
- *H01L 31/062* (2012.01)
- *H01L 31/113* (2006.01)
- *H01L 31/0232* (2006.01)
- *H01L 27/146* (2006.01)
- *H01L 27/00* (2006.01)

(52) U.S. Cl. ............ 348/222.1; 250/208.1; 348/345; 348/302; 348/294; 348/340; 257/291; 257/432; 257/443

(58) Field of Classification Search .......... 250/208.1; 257/291, 432, 443; 348/345, 222.1, 302, 348/294, 340; 356/73.1; 359/742; 349/95
See application file for complete search history.

(56) References Cited

U.S. PATENT DOCUMENTS

| | | | |
|---|---|---|---|
| 7,411,232 B2 | 8/2008 | Ueda et al. | |
| 2006/0011954 A1* | 1/2006 | Ueda et al. | 257/291 |
| 2006/0066743 A1* | 3/2006 | Onozawa et al. | 348/340 |
| 2006/0125948 A1* | 6/2006 | Orita et al. | 348/340 |
| 2006/0284052 A1* | 12/2006 | Toshikiyo et al. | 250/208.1 |
| 2008/0011937 A1* | 1/2008 | Toshikiyo | 250/208.1 |
| 2008/0259191 A1* | 10/2008 | Imamura et al. | 348/294 |

FOREIGN PATENT DOCUMENTS

| | | | |
|---|---|---|---|
| JP | 2005-311015 A | | 11/2005 |
| JP | 2006-032669 A | | 2/2006 |
| JP | 2006032669 | * | 2/2006 |
| JP | 2008-010773 A | | 1/2008 |
| JP | 2008010773 | * | 1/2008 |

OTHER PUBLICATIONS

D.W.Prather, "Design and application of subwavelength diffractive lenses for integration with infrared photodetectors", Opt.Eng.38 870-878(1999).

* cited by examiner

*Primary Examiner* — Jason Chan
*Assistant Examiner* — Stephen Coleman
(74) *Attorney, Agent, or Firm* — Canon U.S.A., Inc. IP Division

(57) ABSTRACT

A device comprises a photoelectric conversion portion including a light receiving surface, and a condensing structure which condenses light to the photoelectric conversion portion, wherein in the condensing structure, a first insulating film and a second insulating film having a refractive index higher than that of the first insulating film are laid out in a plane perpendicular to a normal passing through a center of the light receiving surface such that a density of the second insulating film is higher in a central portion of the plane than in a peripheral portion of the plane, and a layout pattern of the first insulating film and the second insulating film in the plane includes a portion having a dimension not more than a maximum wavelength of a visible light range.

17 Claims, 6 Drawing Sheets

F I G. 2A
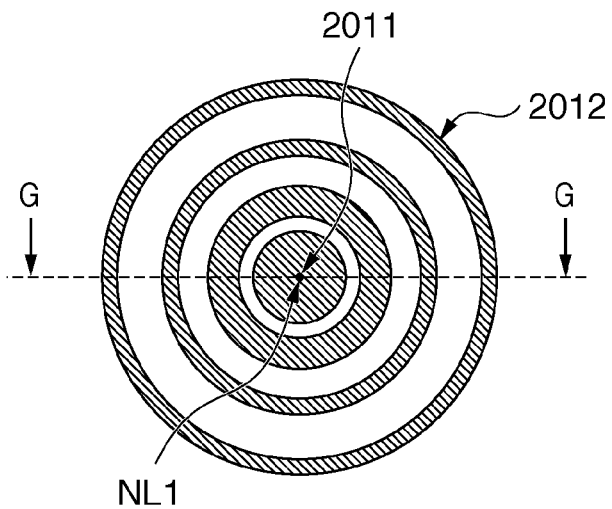
F I G. 2B
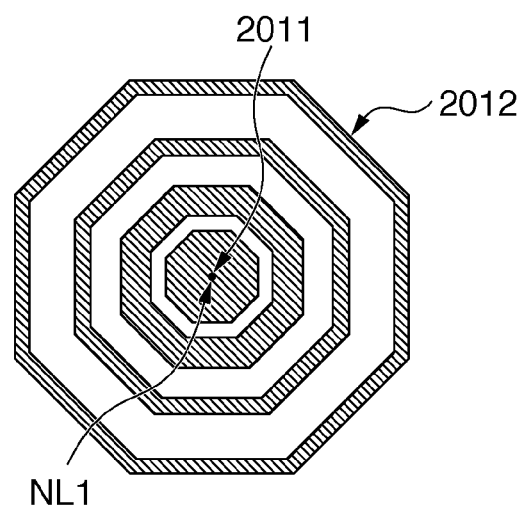
F I G. 2C
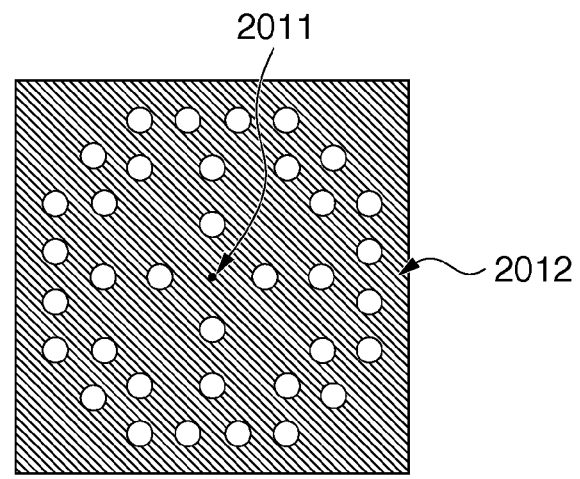

HORIZONTAL POSITION

DEVICE AND IMAGING SYSTEM

BACKGROUND OF THE INVENTION

1. Field of the Invention

The present invention relates to a device and imaging system.

2. Description of the Related Art

Recently, MOS photoelectric conversion devices using MOS transistors as photoelectric conversion devices are being extensively developed. In these photoelectric conversion devices, the area of the light receiving surface of a photoelectric conversion portion (e.g., a photodiode) is decreasing as the pixel density increases and the downsizing of chips advances. Accordingly, the wiring material is being changed to copper more suitable to microfabrication than aluminum.

When using a copper interconnection, a diffusion protector for preventing the diffusion of copper is to be formed because the diffusion coefficient of a copper atom is large in an oxide film generally used as an interlayer insulator. A silicon nitride film is often used as a diffusion protector as an upper layer of a copper interconnection. A diffusion protector is used whenever the diffusion coefficient of the atom of a wiring material in an interlayer insulator is large, regardless of whether the wiring material is copper.

When using a diffusion protector in a photoelectric conversion device, a multilayered structure including an interlayer insulator and diffusion protector is formed. The refractive index of a film suitable for the diffusion protector, e.g., a silicon nitride film differs from that of a silicon oxide film used as the interlayer insulator. This mau pose a situation when the light amount entering the photoelectric conversion portion decreases owing to the influence of reflection or interference in the interface.

Japanese Patent Laid-Open No. 2005-311015 shows that diffusion protectors each have an opening corresponding to the light receiving region of a photodiode. Interlayers made of $SiO_2$ are formed on the light receiving region of the photodiode, and a SiN protective film is formed on the interlayer. Japanese Patent Laid-Open No. 2005-311015 describes that the influence of reflection or multiple interference on the photodiode can be reduced because a region formed on the light receiving region of the photodiode is made of only a silicon oxide film having a single refractive index.

On the other hand, as the planar process techniques represented by photolithography and electron beam lithography advance, it becomes possible to form a micropattern having a dimension equal to or smaller than the visible light wavelength (subwavelength region) on the substrate surface. Accordingly, a condensing element (SubWaveLength Lens: SWLL) having the periodic structure of the subwavelength region is attracting attention. The "subwavelength region" is a region equal to or smaller than the wavelength of object light (visible light).

D. W. Prather (Opt. Eng. 38 870-878) describes that the research group of the Delaware University has proven by simulation that a lattice-like SWLL converted from a Fresnel lens as an aspherical lens has the condensing effect.

As described above, in the technique disclosed in Japanese Patent Laid-Open No. 2005-311015, the diffusion protectors each have the opening corresponding to the light receiving region of the photodiode.

Assume that the dimension of a pixel is decreased. In this case, the diffracting action of incident light at the opening end of each of the diffusion protectors reduces the ratio which the light reaching the light receiving surface of the photoelectric conversion portion accounts for in the light having entered the opening. That is, of the light having entered toward the photoelectric conversion portion, the ratio of light reaching the light receiving surface of the photoelectric conversion portion reduces. This decreases the sensitivity of the photoelectric conversion portion. The diffracting action of the incident light occurs not only at the opening end of the diffusion protector, but also at the interconnection opening end of an interconnection such as aluminum.

SUMMARY OF THE INVENTION

One of aspects of the invention provides a device comprising a photoelectric conversion portion including a light receiving surface, and a condensing structure which condenses light to the photoelectric conversion portion, wherein in the condensing structure, a first insulating film and a second insulating film having a refractive index higher than that of the first insulating film are laid out in a plane perpendicular to a normal passing through a center of the light receiving surface such that a density of the second insulating film is higher in a central portion of the plane than in a peripheral portion of the plane, and a layout pattern of the first insulating film and the second insulating film in the plane includes a portion having a dimension not more than a maximum wavelength of a visible light range.

Further features of the present invention will become apparent from the following description of exemplary embodiments with reference to the attached drawings.

BRIEF DESCRIPTION OF THE DRAWINGS

FIGS. 2A to 2C are views showing practical examples of the layout pattern of a condensing structure 201 shown in FIG. 1;

DESCRIPTION OF THE EMBODIMENTS

Figure 1:
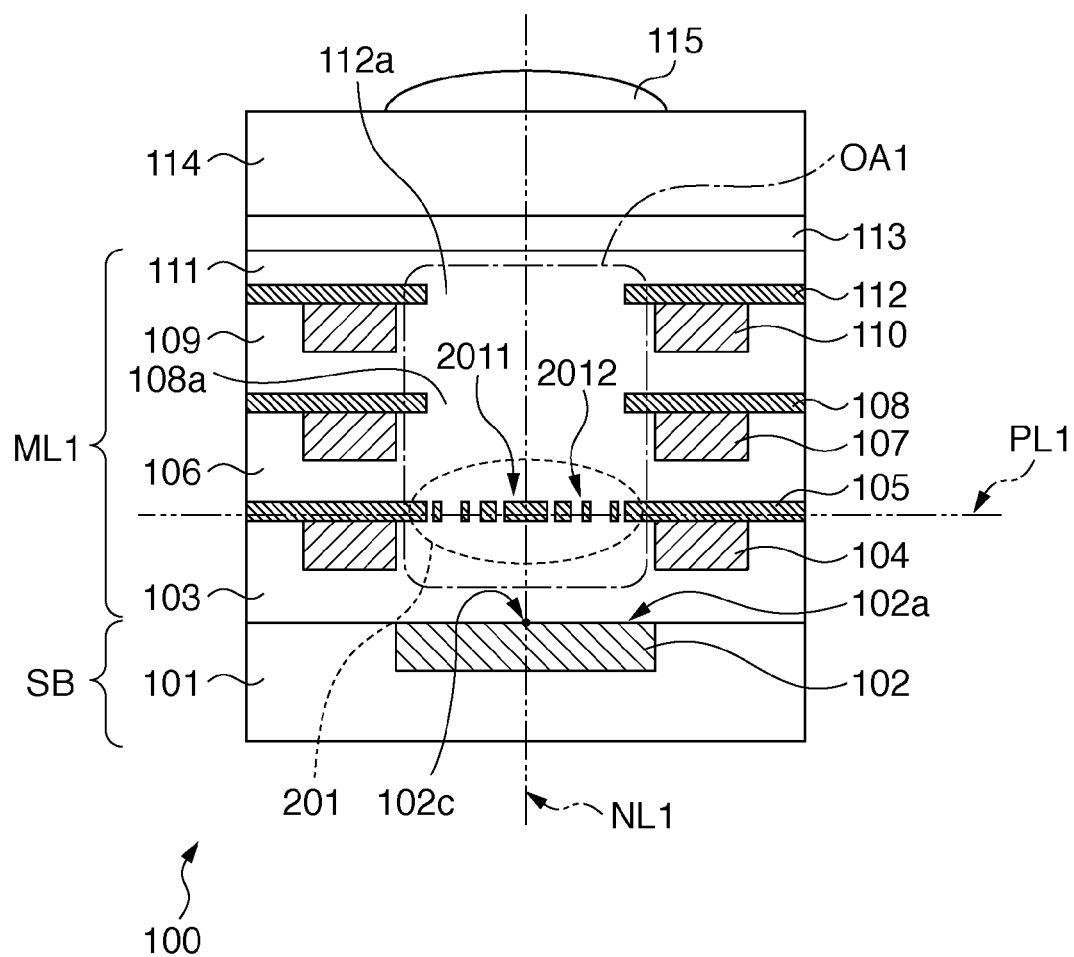
FIG. 1 is a view showing the sectional structure of a photoelectric conversion device 100 according to the first embodiment of the present invention.

A photoelectric conversion device 100 according to the first embodiment of the present invention will be explained below with reference to FIG. 1. FIG. 1 is a view showing the sectional structure of the photoelectric conversion device 100 according to the first embodiment of the present invention.

The photoelectric conversion device 100 includes a photoelectric conversion portion 102, wiring layer (second wiring layer) 104, wiring layers (first wiring layers) 107 and 110, condensing structure 201, passivation film 113, color filter layer 114, and microlens 115.

The photoelectric conversion portion 102 has a light receiving surface 102a, and generates and stores electric charge corresponding to light incident on the light receiving surface 102a. The photoelectric conversion portion 102 is a semiconductor region surrounded by a well region 101 of a semiconductor substrate SB. The well region 101 contains a first-conductivity-type (e.g., p-type) impurity at a low concentration. The photoelectric conversion portion 102 contains an impurity having a conductivity type (e.g., n-type) opposite to the first conductivity type at a high concentration. Note that photoelectric conversion portions 102 are one-dimensionally or two-dimensionally arranged to correspond to the array of pixels in a pixel array region of the semiconductor substrate SB. To simplify the explanation, however, FIG. 1 shows only a photoelectric conversion portion corresponding to a photodiode of one pixel.

The wiring layer 104 is formed below the condensing structure 201, and defines an opening area OA1 corresponding to the photoelectric conversion portion 102. The wiring layer 104 is made of, for example, a material mainly containing copper. A diffusion protector (second insulating film) 105 covers at least the upper surface of the wiring layer 104. The wiring layer 107 is formed above the condensing structure 201, and defines the opening area OA1 corresponding to the photoelectric conversion portion 102. The wiring layer 107 is made of, for example, a material mainly containing copper. A diffusion protector 108 covers at least the upper surface of the wiring layer 107. The wiring layer 110 is formed above the condensing structure 201, and defines the opening area OA1 corresponding to the photoelectric conversion portion 102. The wiring layer 110 is made of, for example, a material mainly containing copper. A diffusion protector 112 covers at least the upper surface of the wiring layer 110. In this embodiment, the three wiring layers 104, 107, and 110 define the opening area OA1.

An interlayer insulator (third insulating film) 103 insulates the semiconductor substrate SB and wiring layer 104. The interlayer insulator 103 is made of, for example, silicon oxide. An interlayer insulator (first insulating film) 106 insulates the wiring layers 104 and 107. The interlayer insulator 106 is made of, for example, silicon oxide. An interlayer insulator 109 insulates the wiring layers 107 and 110. The interlayer insulator 109 is made of, for example, silicon oxide. An interlayer insulator 111 is formed on the interlayer insulator 109. The interlayer insulator 111 is made of, for example, silicon oxide. The wiring layers 104, 107, and 110 are respectively formed by embedding an electrical conductor such as copper in trenches formed in the upper surfaces of the interlayer insulators 103, 106, and 109, and removing the electrical conductor except for the electrical conductor in the trenches by CMP. The wiring layers 104, 107, and 110 each have a damascene structure. The wiring layers 104, 107, and 110, diffusion insulators 105, 108, and 112, and interlayer insulators 103, 106, 109, and 111 form a multilayer wiring structure on the semiconductor substrate SB.

The condensing structure 201 is formed above the photoelectric conversion portion 102, and condenses light to the photoelectric conversion portion 102. In the condensing structure 201, the interlayer insulator 106 and diffusion protector 105 are laid out in a plane PL1 so that the density of the diffusion protector 105 is higher in a central region 2011 than in a peripheral region 2012. The central region 2011 is a region which is formed in the plane PL1 perpendicular to a normal NL1 passing through a center 102c of the light receiving surface 102a, and through which the normal NL1 passes. The peripheral region 2012 is a region formed in the plane PL1 and offset from the normal NL1. The central region 2011 and peripheral region 2012 are arranged in the opening area OA1 (opening area). The diffusion protector 105 covers the wiring layer 104 and extends along the plane PL1 so as to suppress the diffusion of the material mainly containing copper. Also, the diffusion protector 105 has a refractive index higher than that of the interlayer insulator 106. The diffusion protector 105 is made of a silicon-based compound containing carbon, oxygen, or nitrogen, such as silicon nitride or silicon carbide.

The layout pattern of the interlayer insulator 106 and diffusion protector 105 in the plane PL1 includes a portion having a dimension equal to or smaller than the maximum wavelength of the visible light range (see FIGS. 2A to 2C). The visible light range is generally a range having a wavelength of 400 (inclusive) to 750 (inclusive) nm (see OPTRONICS, "Dictionary of Terms of Optical Technologies", 3rd ed.) The dimension equal to or smaller than the maximum wavelength of the visible light range can be, for example, a dimension equal to or smaller than the average value of the upper and lower limits of the visible light range. The dimension equal to or smaller than the maximum wavelength of the visible light range can also be a dimension equal to or smaller than the peak wavelength of the spectral transmittance of the color filter formed in the pixel. Alternatively, when a phosphor converts incident light (e.g., radiation) into visible light and the microlens receives the converted light, the dimension equal to or smaller than the maximum wavelength of the visible light range can be a dimension equal to or smaller than the peak wavelength of the light converted by the phosphor.

The condensing structure 201 having a pattern density distribution equal to or smaller than the wavelength of incident light is formed in the opening area OA1 corresponding to the photoelectric conversion portion 102 by using the diffusion protector 105. That is, the diffusion protector 105 has a patterned opening in the opening area OA1, and extends along the plane PL1. The interlayer insulator 106 fills the opening in the diffusion protector 105. In the condensing structure 201, the interlayer insulator 106 is formed to cover the upper surface of the diffusion protector 105, and the interlayer insulator 103 is formed to cover the lower surface of the diffusion protector 105. The interlayer insulators 103 and 106 each have a refractive index lower than that of the diffusion protector 105. In the layout pattern, the density of the diffusion protector 105 in the central region 2011 is higher than that of the diffusion protector 105 in the peripheral region 2012 (see FIGS. 2A to 2C). On the other hand, the diffusion protectors 108 and 112 respectively have openings 108a and 112a corresponding to the opening area OA1.

The passivation film 113 is formed on the interlayer insulator 111 so as to protect the semiconductor substrate SB and a multilayered wiring structure ML1. The color filter layer 114 is formed on the passivation film 113, and selectively transmits light having the wavelength of a specific color (e.g., R, G, or B) in the visible light range, of light having passed through the microlens 115. The microlens 115 is formed on the color filter layer 114, and guides the incident light to the color filter 114 by refracting the light.

Referring to FIG. 1, the condensing structure 201 is formed in the plane PL1 formed along the direction in which the diffusion protector 105 extends. However, the condensing structure 201 may also be formed in a plane formed along the direction in which at least one of the diffusion protectors 105, 108, and 112 extend. That is, the condensing structure 201 is formed in the same layer as that of one or a plurality of diffusion protectors. The shape of the condensing structure 201 is not particularly limited as long as the structure makes the effective refractive index in the central portion of the opening area corresponding to the photoelectric conversion portion higher than that in the outer periphery of the opening area by using the pattern density distribution equal to or smaller than the wavelength of incident light in the visible light range. The increase in effective refractive index from the outer periphery to the central portion in the condensing structure is arbitrary; the increase can be monotone increase or step increase. An antireflection film for reducing the reflection of incident light in the interface between the interlayer insulator 103 and semiconductor substrate SB may also be formed between them. The number of wiring layers is also not limited to three. Furthermore, an intra-layer lens may also be formed between the interlayer insulator 111 and color filter layer 114.

Practical examples of the layout pattern of the condensing structure 201 will be explained below with reference to FIGS. 2A to 2C. FIGS. 2A to 2C each illustrate a practical example of the layout pattern of the condensing structure 201. Referring to FIGS. 2A to 2C, hatched regions are occupied by the diffusion protector 105, and white regions between the hatched regions are occupied by the interlayer insulator 106.

In the layout pattern shown in FIG. 2A, a plurality of circles are arranged centering around the normal NL1 along the plane PL1 (see FIG. 1). That is, the layout pattern shown in FIG. 2A is a concentric pattern. This concentric pattern is formed to have a density distribution. In the central region 2011 near the normal NL1 of the concentric circles, the density of the diffusion protector 105 having a refractive index higher than that of the interlayer insulator 106 is high. In the peripheral region 2012 offset from the normal NL1 of the concentric circles, the density of the diffusion protector 105 having a high refractive index is low. This makes the effective refractive index of the central region 2011 higher than that of the peripheral region 2012.

Figure 3:
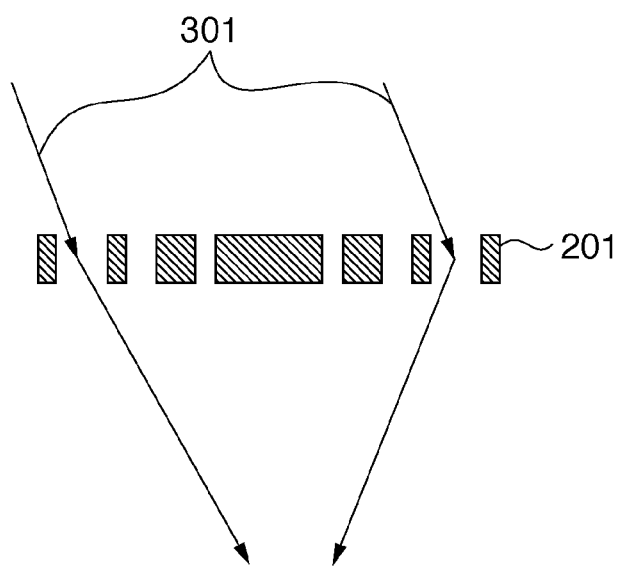
FIG. 3 is a sectional view taken along a line G-G in FIG. 2A.
Figure 4:
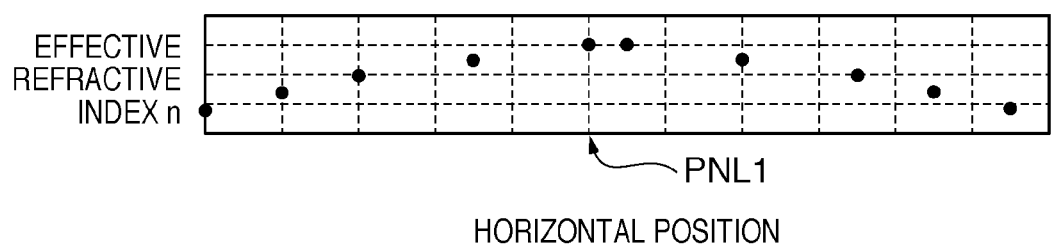
FIG. 4 is a graph showing the simulation result of the effective refractive index distribution with respect to the layout pattern shown in FIG. 2A.

For example, the simulation result shown in FIG. 4 was obtained by deciding a plurality of evaluation points in a G-G section passing the normal NL1 with respect to the layout pattern shown in FIG. 2A, and calculating the effective refractive indices at the evaluation points. FIG. 4 is a graph showing the simulation result of the effective refractive index distribution with respect to the layout pattern shown in FIG. 2A. The effective refractive index is a numerical value indicating an actual refractive index in a certain position with respect to the wavelength of certain incident light, and almost equal to the average value of refractive indices near the position. Since the planar pattern is a fine pattern equal to or smaller than the wavelength, films having different refractive indices exist at a period equal to or shorter than the wavelength. For example, the effective refractive index at a certain point can be regarded as the average refractive index in a circle having the point as the center and having a radius equal to the wavelength. As shown in FIG. 4, the effective refractive index is highest in a center PNL1 of the concentric circles, and decreases toward the outer periphery. Therefore, when compared to a layout pattern in which a diffusion protector has a perfect opening (an opening having no diffusion protector in a region where light passes, such as the opening 108a or 112a shown in FIG. 1), the layout pattern shown in FIG. 2A can readily refract light propagating to the light receiving surface 102a of the photoelectric conversion portion 102. For example, as shown in FIG. 3 as a sectional view taken along a line G-G in FIG. 2A, light rays 301 can be refracted toward the light receiving surface 102a of the photoelectric conversion portion 102 by forming a structure that makes the effective refractive index in the central portion higher than that in the outer periphery by using a pattern density distribution equal to or lower than the wavelength of incident light. This facilitates condensing light having entered toward the photoelectric conversion portion 102 to the light receiving surface 102a.

Similarly, in the layout pattern shown in FIG. 2B, a plurality of polygons (e.g., octagons) are arranged centering around the normal NL1 along the plane PL1 (see FIG. 1). That is, the layout pattern shown in FIG. 2B is the pattern of concentric polygons. The pattern of concentric polygons is formed to have a density distribution. In the central region 2011 near the normal NL1 of the concentric polygons, the density of the diffusion protector 105 having a refractive index higher than that of the interlayer insulator 106 is high. In the peripheral region 2012 offset from the normal NL1 of the concentric polygons, the density of the diffusion protector 105 having a high refractive index is low. This makes the effective refractive index of the central region 2011 higher than that of the peripheral region 2012.

On the other hand, in the layout pattern shown in FIG. 2C, a plurality of holes or dots are arranged along the plane PL1 so as to symmetrically distribute with respect to the normal NL1. That is, in the layout pattern shown in FIG. 2C, the density of holes in the diffusion protector 105 in the central region 2011 is lower than that of holes in the diffusion protector 105 in the peripheral region 2012. Accordingly, in the central region 2011 near the normal NL1, the density of the diffusion protector 105 having a refractive index higher than that of the interlayer insulator 106 is high. In the peripheral region 2012 offset from the normal NL1, the density of the diffusion protector 105 having a high refractive index is low. This makes the effective refractive index of the central region 2011 higher than that of the peripheral region 2012. Therefore, when compared to a layout pattern in which a diffusion protector has a perfect opening (an opening having no diffusion protector in a region where light passes, such as the opening 108a or 112a shown in FIG. 1), the layout pattern shown in FIG. 2C can readily refract light propagating to the light receiving surface 102a of the photoelectric conversion portion 102. This facilitates condensing light having entered toward the photoelectric conversion portion 102 to the light receiving surface 102a.

In the first embodiment as described above, the condensing structure in which the effective refractive index of the central region near the normal is higher than that of the peripheral region offset from the normal is formed above the photoelectric conversion portion. This makes it possible to increase the ratio which the light reaching the light receiving surface of the photoelectric conversion portion accounts for in the light having entered toward the photoelectric conversion portion.

A method of manufacturing the photoelectric conversion device 100 according to the first embodiment of the present invention will be explained below with reference to FIG. 1. The explanation will be made by taking, for example, a damascene structure in which an interconnection is embedded in an interlayer insulator by using copper as the wiring material.

First, a plurality of semiconductor regions (not shown) functioning as the sources or drains of transistors and element isolation regions (not shown) for separating elements such as the transistors are formed in addition to a photoelectric conversion portion 102 in the semiconductor substrate SB. Then, a gate insulating film is formed on the semiconductor substrate SB, gate electrodes (not shown) of the transistors are formed by, for example, polysilicon, and a silicon oxide film is deposited by CVD (Chemical Vapor Deposition). After that, the silicon oxide film is planarized by CMP (Chemical Mechanical Polishing), thereby forming an interlayer insulator 103, and contacts (not shown) are formed in the interlayer insulator 103.

Subsequently, a wiring layer 104 is embedded in the interlayer insulator 103 by the damascene method. This damascene method can be either the single damascene method or dual damascene method. After that, a diffusion protector 105 is formed on the entire surface by using silicon nitride or the like. The film thickness of the silicon nitride 105 is about 30 nm or more, and the upper limit is the thickness (400 μm) between the wiring layer 104 and a wiring layer 107. After that, lithography and dry etching are used to form a condensing structure 201 in which the diffusion protector 105 formed in a region corresponding to the photoelectric conversion portion 102 is formed into concentric coarse/fine patterns having a dimension equal to or smaller than the maximum wavelength of the visible light range.

Then, a silicon oxide film is formed as an interlayer insulator 106 by CVD. In the formation of the interlayer insulator 106, CMP may also be used for a reduction of the influence of the steps of the diffusion protector 105 and condensing structure 201. A wiring layer 107 is embedded in the interlayer insulator 106 by the damascene method. Contacts are formed in the interlayer insulator 106 before or simultaneously with the formation of the wiring layer 107. After a diffusion protector 108 is formed on the entire surface by using a silicon nitride film or the like, lithography and dry etching are used to remove the diffusion protector 108 formed in the region corresponding to the photoelectric conversion portion. However, the diffusion protector 108 may also be left behind if the refractive index difference between the diffusion protector 108 and interlayer insulator 106 is not so large.

In addition, a silicon oxide film is formed as an interlayer insulator 109 by CVD. In the formation of the interlayer insulator 109, CMP may also be used for a reduction of the influence of the step of the diffusion protector 108. A wiring layer 110 is embedded in the interlayer insulator 109 by the damascene method. Contacts are formed in the interlayer insulator 108 before or simultaneously with the formation of the wiring layer 110. After a diffusion protector 112 is formed on the entire surface by using a silicon nitride film or the like, lithography and dry etching are used to remove the diffusion protector 112 formed in the region corresponding to the photoelectric conversion portion. However, the diffusion protector 112 may also be left behind if the refractive index difference between the diffusion protector 112 and interlayer insulator 109 is not so large.

Furthermore, a silicon oxide film is formed by CVD and planarized, thereby forming an interlayer insulator 111. In the formation of the interlayer insulator 111, CMP may also be used for a reduction of the influence of the step of the diffusion protector 112. After a passivation film 113 is formed on the entire surface by CVD, planarization is performed using a resin. Then, a color filter layer 114 is formed, and planarization is performed using a resin again. After that, a microlens 115 is formed.

As described above, the condensing structure 201 can be formed by using the steps of patterning that portion of the diffusion protector 105 which is positioned above the photoelectric conversion portion 102. By forming the condensing structure in a multilayered wiring structure by using the above steps, it is possible to refract light in a region close to the light receiving surface 102a by the microlens or a known intralayer lens. Accordingly, even light having a large incident angle or light diffracted by a wiring layer can reach the light receiving surface 102a of the photoelectric conversion portion 102. That is, the decreases in incident light amount and sensitivity can be reduced by simple steps.

Figure 5:
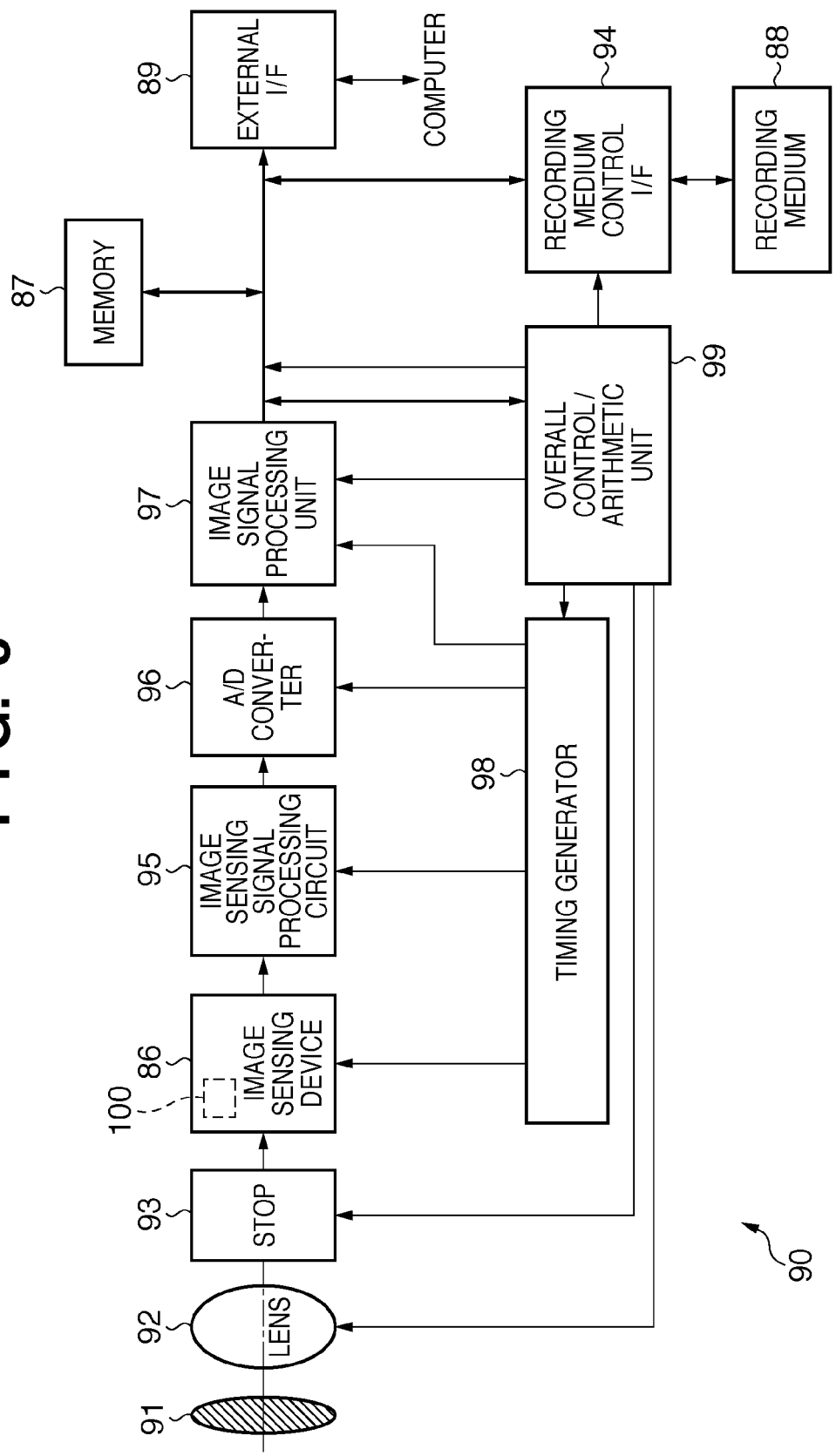
FIG. 5 is a view showing the configuration of an imaging system using the photoelectric conversion device according to the first embodiment.

FIG. 5 shows an example of an imaging system using the photoelectric conversion device of the present invention.

As shown in FIG. 5, an imaging system 90 mainly includes an optical system, image sensing device 86, and signal processing unit. The optical system mainly includes a shutter 91, lens 92, and stop 93. The image sensing device 86 includes the photoelectric conversion device 100. The signal processing unit mainly includes an image sensing signal processing circuit 95, A/D converter 96, image signal processing unit 97, memory 87, external I/F 89, timing generator 98, overall control/arithmetic unit 99, recording medium 88, and recording medium control I/F 94. Note that the signal processing unit may or may not include the recording medium 88.

The shutter 91 is installed before the lens 92 on the optical path, and controls exposure.

The lens 92 refracts incident light, and forms an image of an object on the image sensing surface of the photoelectric conversion device 100 of the image sensing device 86.

The stop 93 is installed between the lens 92 and photoelectric conversion device 100 on the optical path, and adjusts the amount of light having passed through the lens 92 and guided to the photoelectric conversion device 100.

The photoelectric conversion device 100 of the image sensing device 86 converts the object image formed on the image sensing surface of the photoelectric conversion device 100 into an image signal. The image sensing device 86 reads out the image signal from the photoelectric conversion device 100, and outputs the readout image signal.

The image sensing signal processing circuit 95 is connected to the image sensing device 86, and processes the output image signal from the image sensing device 86.

The A/D converter 96 is connected to the image sensing signal processing circuit 95, and converts the processed image signal (analog signal) output from the image sensing signal processing circuit 95 into a digital signal.

The image signal processing unit 97 is connected to the A/D converter 96, and performs arithmetic processing such as various corrections on the output image signal (digital signal) from the A/D converter 96, thereby generating image data. This image data is supplied to the memory 87, external I/F 89, overall control/arithmetic unit 99, recording medium control I/F 94, and the like.

The memory 87 is connected to the image signal processing unit 97, and stores the output image data from the image signal processing unit 97.

The external I/F 89 is connected to the image signal processing unit 97. The external I/F 89 transfers the output image data from the image signal processing unit 97 to an external apparatus (e.g., a personal computer).

The timing generator 98 is connected to the image sensing device 86, image sensing signal processing circuit 95, A/D converter 96, and image signal processing unit 97. The timing generator 93 supplies timing signals to the image sensing device 86, image sensing signal processing circuit 95, A/D converter 96, and image signal processing unit 97. The image sensing device 86, image sensing signal processing circuit 95, A/D converter 96, and image signal processing unit 97 operate in synchronism with the timing signals.

The overall control/arithmetic unit 99 is connected to the timing generator 98, image signal processing unit 97, and recording medium control I/F 94, and collectively controls the timing generator 98, image signal processing unit 97, and recording medium control I/F 94.

The recording medium 88 is detachably connected to the recording medium control I/F 94. The output image data from the image signal processing unit 97 is recorded on the recording medium 88 via the recording medium control I/F 94.

In the above arrangement, a good image (image data) can be obtained when a good image signal is obtained in the photoelectric conversion device 100.

Figure 6:
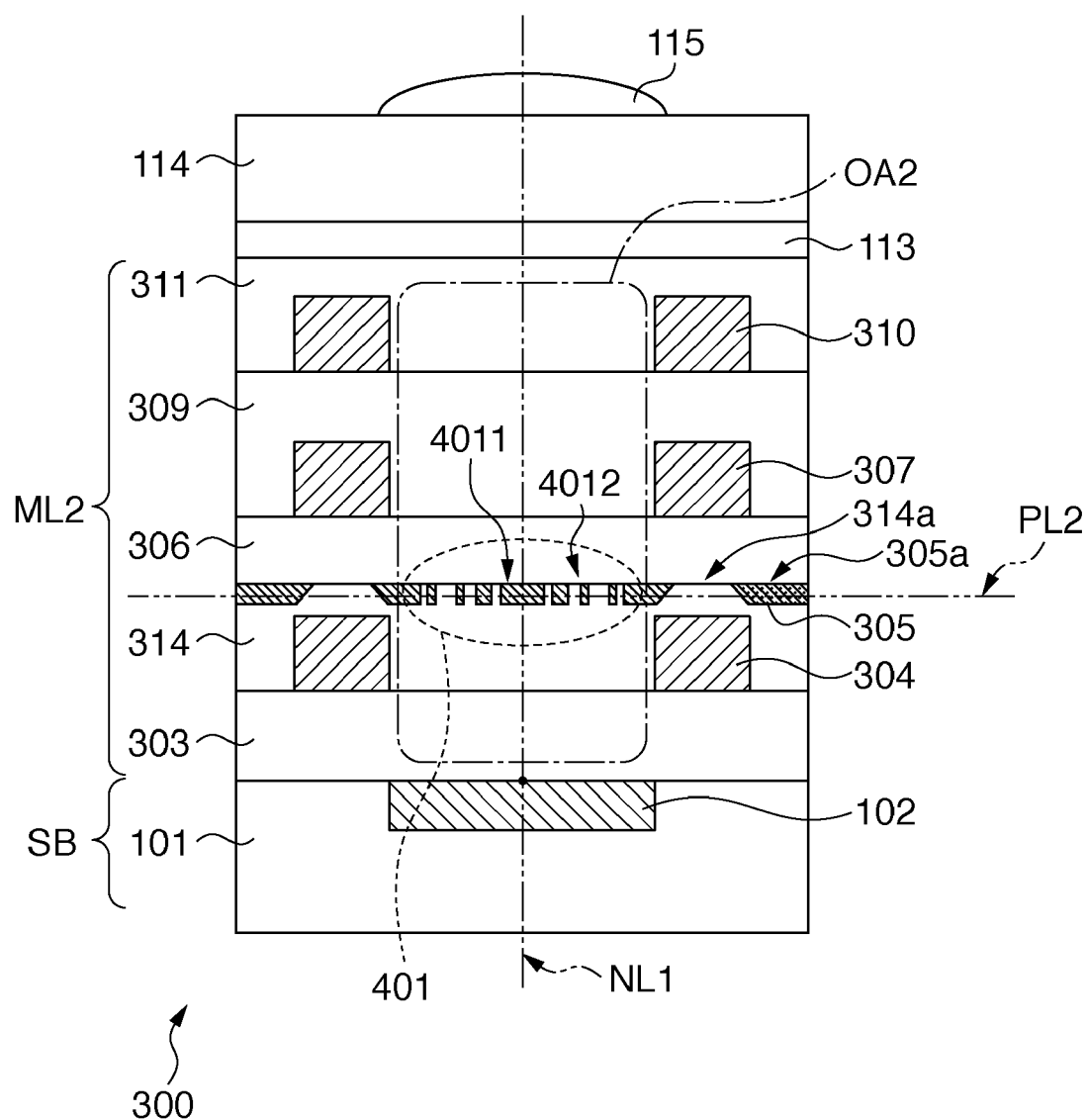
FIG. 6 is a view showing the sectional structure of a photoelectric conversion device 300 according to the second embodiment of the present invention.

A photoelectric conversion device 300 according to the second embodiment of the present invention will be explained below with reference to FIG. 6. FIG. 6 is a view showing the sectional structure of the photoelectric conversion device 300 according to the second embodiment of the present invention. In the following description, differences from the first embodiment will mainly be explained.

The photoelectric conversion device 300 includes a wiring layer (second wiring layer) 304, wiring layers (first wiring layers) 307 and 310, and condensing structure 401.

The wiring layer 304 is made of, for example, a material mainly containing aluminum, and is not covered with the diffusion protector 105 (see FIG. 1). Since the material mainly containing aluminum hardly diffuses in a silicon oxide film forming an interlayer insulator, the wiring layer may or may not be covered with the diffusion protector. An interlayer insulator (third insulating film) 314 and an interlayer insulator (first insulating film) 306 insulate the wiring layers 304 and 307. An insulating film (second insulating film) 305 is formed between the wiring layers 304 and 307. The insulating film 305 is made of a silicon-based compound containing carbon, oxygen, or nitrogen, such as silicon nitride, and the film thickness can be about 30 (inclusive) nm to 400 (inclusive) μm. The insulating film 305 functions as a polishing stop layer in the step of planarizing the upper surface of the interlayer insulator 314. That is, the insulating film 305 extends along a plane PL2 above the wiring layer 304 so as to stop polishing above the wiring layer 304. An upper surface 305a of the insulating film 305 and a surface 314a of that portion of the interlayer insulator 314 which is positioned above the wiring layer 304 form a continuous surface along the plane PL2. This forms a structure suited to effectively reducing that step on the upper surface of the interlayer insulator 306, which is formed by the unevenness of the wiring layer 304. The wiring layer 307 is made of, for example, a material mainly containing aluminum, and is not covered with the diffusion protector 108 (see FIG. 1). The wiring layer 310 is made of, for example, a material mainly containing aluminum, and is not covered with the diffusion protector 112 (see FIG. 1). An interlayer insulator (third insulating film) 303 insulates a semiconductor substrate SB and the wiring layer 304. The wiring layers 304, 307, and 310, the interlayer insulators 303 and 306, and interlayer insulators 309 and 311 form a multilayered wiring structure ML2 on the semiconductor substrate SB. In the multilayered wiring structure, the semiconductor substrate SB, the wiring layers 304, 307, and 310 are connected via the contact with each other at the designed positions.

In the condensing structure 401, the interlayer insulator 314 and insulating film 305 are laid out in the plane PL2 such that the density of the insulating film 305 is higher in a central region 4011 than in a peripheral region 4012. Details of the arrangement of the condensing structure 401 are the same as those of the first embodiment.

Figure 7A:
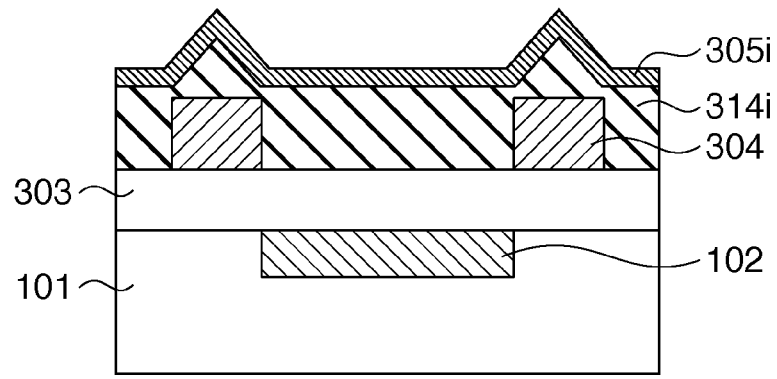
FIGS. 7A to 7C are sectional views showing the steps of a method of manufacturing the photoelectric conversion device 300 according to the second embodiment of the present invention.
Figure 7B:
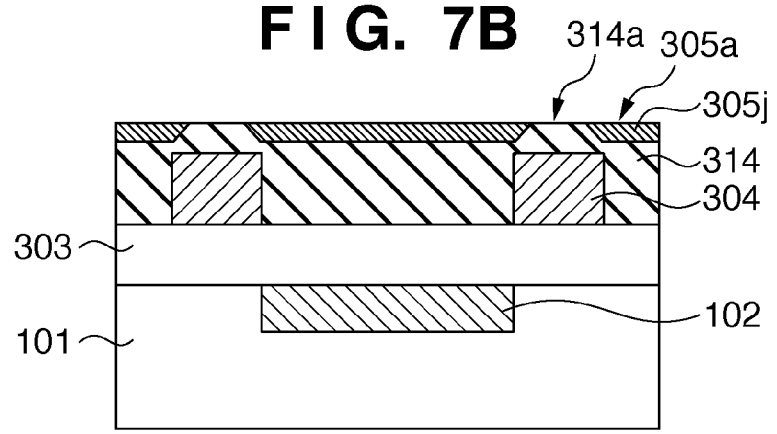
Figure 7C:
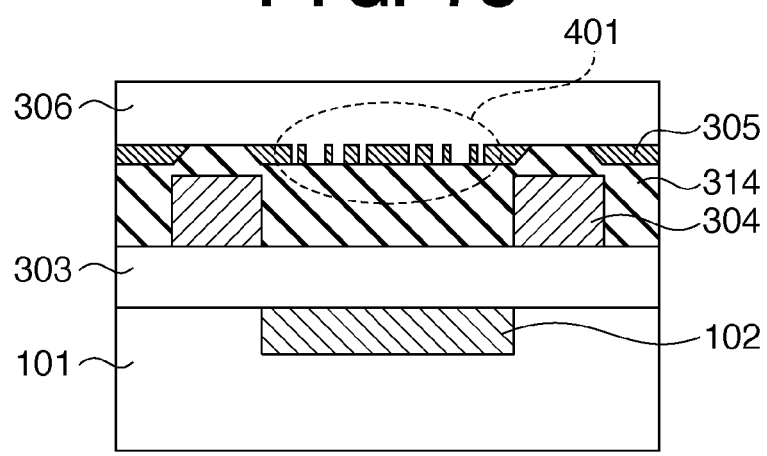

As shown in FIGS. 7A to 7C, a method of manufacturing the photoelectric conversion device 300 differs from the first embodiment in the following points. FIGS. 7A to 7C are sectional views showing the steps of the method of manufacturing the photoelectric conversion device 300 according to the second embodiment of the present invention.

In the step shown in FIG. 7A, an interlayer insulator 303 is planarized, and a wiring layer 304 is formed on the interlayer insulator 303 by lithography and dry etching. After that, a silicon oxide film 314i serving as an interlayer insulator 314 is formed by CVD to cover the interlayer insulator 303 and wiring layer 304. In addition, a silicon nitride film 305i is formed to cover the silicon oxide film 314i.

In the step shown in FIG. 7B, an interlayer insulator 314 and insulating film 305j are formed by planarizing the silicon oxide film 314i and silicon nitride film 305i. Since a flat portion of the silicon nitride film 305i functions as a polishing stop layer in the CMP step, an upper surface 305a of the insulating film 305j and a surface 314a of that portion of the interlayer insulator 314 which is positioned above the wiring layer 304 form a continuous surface along the plane PL2 (see FIG. 6).

In the step shown in FIG. 7C, lithography and dry etching are used to pattern that portion of the insulating film 305j which corresponds to a photoelectric conversion portion 102, thereby forming an insulating film 305 having an opening. Then, a silicon oxide film is formed by CVD so as to fill the opening in the insulating film 305 and cover the upper surface of the insulating film 305, thereby forming an interlayer insulator 306. Consequently, a condensing structure 401 using coarse/fine patterns equal to or smaller than the wavelength of light is formed.

The central region of the condensing structure 401 may also be a region where a straight line connecting the center of the light receiving surface and the center of the opening area passes. In this case, the peripheral region of the condensing structure 401 is a region offset from the straight line connecting the center of the light receiving surface and the center of the opening area. This makes the present invention applicable even when a normal passing the center of the light receiving surface is offset from the center of the opening area or from the center of the microlens in order to cope with oblique light.

The embodiments of the present invention have been explained above. However, the arrangement of the present invention is not limited to the above embodiments. For example, a plurality of condensing structures may also be formed, and the layout patterns of the interlayer insulators and diffusion protectors in the condensing structure are not limited to those shown in FIGS. 2A to 2C. The individual embodiments can appropriately be combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-041298, filed Feb. 24, 2009, and No. 2010-012582, filed Jan. 22, 2010, which are hereby incorporated by reference herein in their entirety.

What is claimed is:

1. A device comprising:
a photoelectric conversion portion including a light receiving surface; and
a condensing structure which condenses light to the photoelectric conversion portion,
wherein the condensing structure includes a first insulating film and a second insulating film having a refractive index higher than that of the first insulating film, the second insulating film is arranged along a first plane parallel to the light receiving surface, the first insulating film includes portions arranged between a second plane including an upper surface of the second insulating film and a third plane including a lower surface of the second insulating film, and a density of the second insulating film is higher in a central portion of the first plane than in a peripheral portion of the first plane, and a layout pattern of the first insulating film and the second insulating film in the first plane includes a portion having a dimension not more than a maximum wavelength of a visible light range.

2. The device according to claim 1, wherein
the second insulating film has an opening and
the first insulating film fills the opening.

3. The device according to claim 1, wherein in the condensing structure, the first insulating film is formed to cover an upper surface of the second insulating film, and a third insulating film having a refractive index lower than that of the second insulating film is formed to cover a lower surface of the second insulating film.

4. The device according to claim 1, wherein in the layout pattern, a plurality of circles or a plurality of polygons are arranged centering around a center of the central portion along the first plane.

5. The device according to claim 1, wherein in the layout pattern, a plurality of holes or a plurality of dots are arranged along the first plane to symmetrically distribute with respect to a center of the central portion.

6. The device according to claim 1, further comprising:
a first wiring layer formed above the condensing structure, and defining an opening area corresponding to the photoelectric conversion portion; and
a second wiring layer formed below the condensing structure, and defining the opening area corresponding to the photoelectric conversion portion.

7. The device according to claim 6,
wherein the central portion and the peripheral portion are arranged in the opening area.

8. The device according to claim 7, wherein
the second wiring layer is made of a material mainly containing copper, and
the second insulating film covers the second wiring layer to suppress diffusion of the material mainly containing copper.

9. The device according to claim 7, wherein the second wiring layer is made of a material mainly containing aluminum.

10. The device according to claim 9, wherein the second insulating film extends above the second wiring layer to stop polishing above the second wiring layer.

11. The device according to claim 1, wherein
the first insulating film is made of silicon oxide, and
the second insulating film is made of a silicon-based compound containing one of carbon, oxygen, and nitrogen.

12. The device according to claim 7, wherein
a center of the opening area is offset from a normal passing through a center of the light receiving surface,
center of the central portion is a region where a straight line connecting the center of the light receiving surface and the center of the opening area passes.

13. An imaging system comprising:
the device cited in claim 1;
an optical system which forms an image on an image sensing surface of the device; and
a signal processing unit which generates image data by processing a signal output from the photoelectric conversion device.

14. The imaging system according to claim 13, wherein
the second insulating film has an opening, and
the first insulating film fills the opening.

15. The imaging system according to claim 14, wherein in the condensing structure, the first insulating film is formed to cover an upper surface of the second insulating film, and a third insulating film having a refractive index lower than that of the second insulating film is formed to cover a lower surface of the second insulating film.

16. The imaging system according to claim 14, wherein in the layout pattern, a plurality of circles or a plurality of polygons are arranged centering around a center of the central portion along the first plane.

17. The imaging system according to claim 14, wherein in the layout pattern, a plurality of holes or a plurality of dots are arranged along the first plane to symmetrically distribute with respect to a center of the central portion.

* * * * *